United States Patent
Hsu et al.

(10) Patent No.: US 8,964,492 B2
(45) Date of Patent: Feb. 24, 2015

(54) TRACKING MECHANISM FOR WRITING TO A MEMORY CELL

(75) Inventors: Kuoyuan (Peter) Hsu, San Jose, CA (US); Bing Wang, Palo Alto, CA (US); Derek C. Tao, Fremont, CA (US); Yukit Tang, San Jose, CA (US); Kai Fan, Los Altos, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 223 days.

(21) Appl. No.: 13/560,461

(22) Filed: Jul. 27, 2012

(65) Prior Publication Data

US 2014/0032871 A1    Jan. 30, 2014

(51) Int. Cl.
    *G11C 7/00*    (2006.01)
    *G11C 7/02*    (2006.01)

(52) U.S. Cl.
    USPC ........................ 365/194; 365/191; 365/210.14

(58) Field of Classification Search
    CPC ............. G11C 13/0069; G11C 7/1096; G11C 11/419; G11C 2013/0088; G11C 11/1675
    USPC ......... 365/189.16, 194, 210.14, 154; 713/500
    See application file for complete search history.

(56) References Cited

U.S. PATENT DOCUMENTS

| | | | | |
|---|---|---|---|---|
| 5,553,276 A | * | 9/1996 | Dean | 713/500 |
| 6,646,938 B2 | * | 11/2003 | Kodama | 365/210.14 |
| 6,731,534 B1 | * | 5/2004 | Fan | 365/154 |
| 2008/0298143 A1 | * | 12/2008 | Chen et al. | 365/194 |

* cited by examiner

*Primary Examiner* — Toan Le
*Assistant Examiner* — Ajay Ojha
(74) *Attorney, Agent, or Firm* — Lowe Hauptman & Ham, LLP

(57) ABSTRACT

A circuit includes a tracking write circuit and a write circuit. Various write signals of the write circuit are generated based on tracking signals of the tracking write circuit. The write signals are used in a write operation of a memory cell.

20 Claims, 6 Drawing Sheets

TRACKING MECHANISM FOR WRITING TO A MEMORY CELL

FIELD

The present disclosure is related to a tracking mechanism for writing to a memory cell.

BACKGROUND

Write tracking circuits for memory cells provide tracking signals based on which write signals are generated for use in writing data to a memory cell. As technologies evolve, existing tracking circuits for use with older technologies are no longer suitable.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
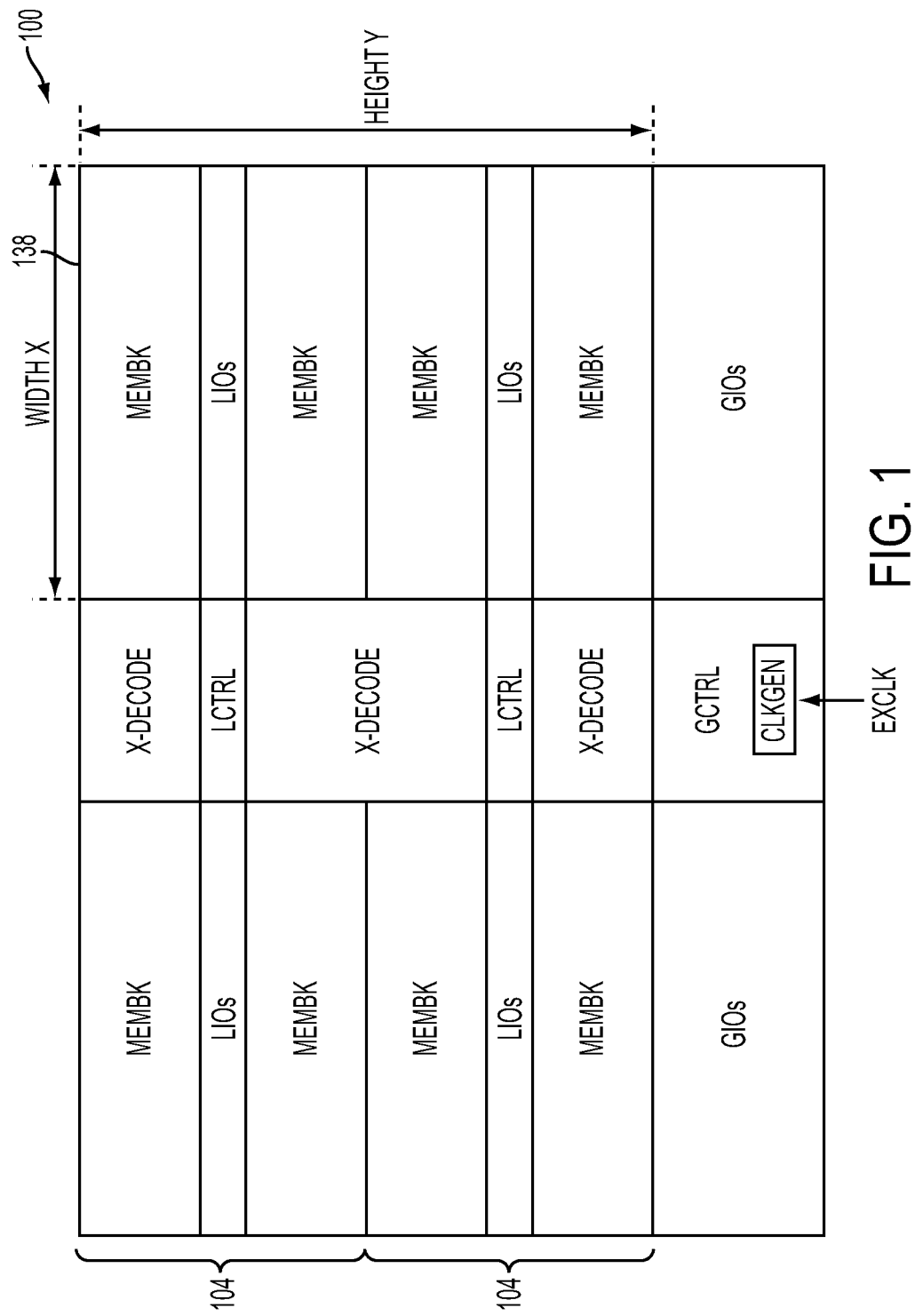
FIG. 1 is a diagram of a memory macro, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. Tracking circuits including tracking cells track the critical or worst case conditions of memory cells in a memory macro.

Memory Macro

FIG. 1 is a diagram of a memory macro 100, in accordance with some embodiments. In the embodiment of FIG. 1, memory macro 100 is a static random access memory (SRAM) macro. SRAM is used for illustration. Other types of memories are within the scope of various embodiments. In this document, "rise" refers to transitioning from a low to a high logical value, and "fall" refers to transitioning from a high to a low logical value.

Memory macro 100 is symmetrical. For example, with reference to decoders X-Decode, local control circuits (LCTRLs), and a global control circuit (GCTRL), circuit elements on the left side are similar to circuit elements on the right side of memory macro 100. For another example, memory macro 100 includes two memory arrays, one on the left side and one on the right side. For illustration, one memory array on the right side is labeled as memory array 138, and has a width X and a height Y.

Memory macro 100 includes a plurality of memory segments 104. Two memory segments 104 are shown for illustration. A different number of memory segments 104 is within the scope of various embodiments. Each segment 104 includes four memory banks MEMBK, two memory banks on the left and two memory banks on the right. On each of the left and right side of memory macro 100, two memory banks share a row of a plurality of local input-output circuits or local input-outputs LIOs. Memory cells in a memory bank are arranged in rows and columns. As a result, memory cells in a memory segment 104 and in a memory array are also arranged in rows and columns. A memory cell is described with reference to FIG. 3 below, and is labeled MEMCELL. Different configurations of a memory segment are within the scope of various embodiments.

Address decoders X-Decode provide the X- or row-address of memory cells to be accessed for a read or a write operation. Local control LCTRL controls local input-outputs LIOs. Global input-output circuits GIO serve to transfer data between memory cells and other circuits outside of memory macro 100. Global control GCTRL provides the X- (or row address), Y- (or column address) pre-decode, clock, and other signals for memory macro 100. Global control GCTRL also controls data transfer between memory cells in the memory array and circuits outside of memory macro 100.

A write clock generator CLKGEN receives an external write clock signal EXCLK, and generates corresponding write and tracking write signals, which are explained in details below with reference to FIG. 2 to FIG. 6.

Write Circuit

Figure 2:
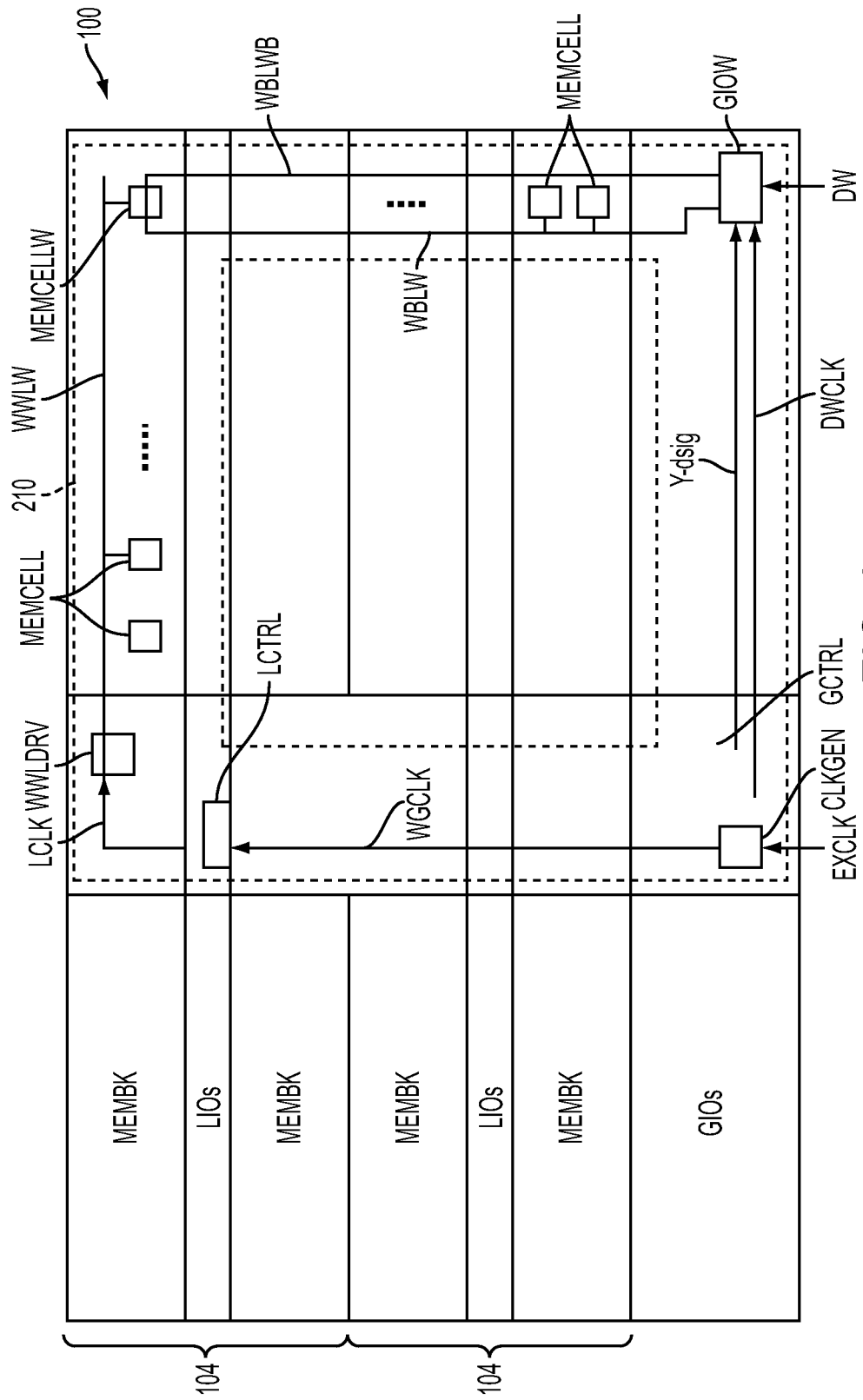
FIG. 2 is a diagram of a circuit in the memory macro used to illustrate writing to a memory cell, in accordance with some embodiments.

FIG. 2 is a block diagram of memory macro 100 having a write circuit 210, in accordance with some embodiments. For simplicity, various elements of memory macro 100 are not shown or labeled. Write circuit 210 includes clock generator CLKGEN, local control LCTRL, write word line driver WWLDRV, and global input-output GIOW. Write circuit 210 is used to illustrate a write signal path including write signals for writing to a memory cell MEMCELLW. For illustration, memory cell MEMCELLW is on the right side of memory macro 100, and is farthest in both the Y- and the X-directions with reference to clock generator CLKGEN.

Figure 4:
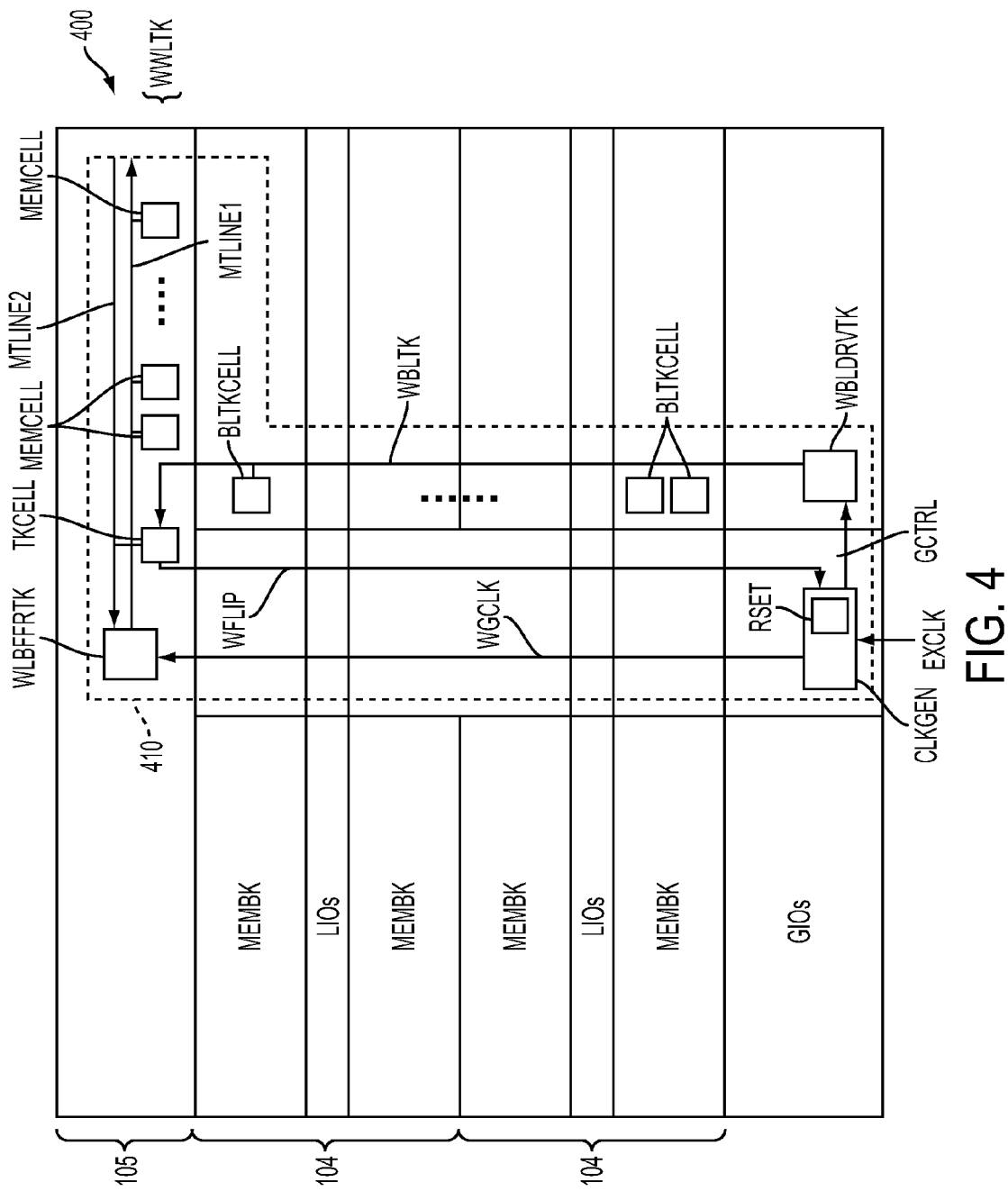
FIG. 4 is a diagram of a tracking write circuit, in accordance with some embodiments.

A write word line WWLW is coupled with a plurality of memory cells MEMCELL in a row of memory array 138, including memory cell MEMCELLW. A pair of write bit lines WBLW and WBLWB is coupled with another plurality of memory cells in a column of memory array 138, which also includes memory cell MEMCELLW. Write word line WWLW has a signal SWWLW (not labeled) thereon. Each of write word line WWLW, write bit line WBLW, and WBLWB has a corresponding resistance, capacitance, and time delay, based on which tracking circuit 410 in FIG. 4 is designed accordingly.

Effectively, memory cell MEMCELLW is coupled with write word line WWLW and with the pair of write bit lines WBLW and WBLWB. Write word line signal SWWLW on write word line WWLW is used to activate memory cell MEMCELLW so that data represented by write bit lines WBLW and WBLWB is written into memory cell MEM- CELLW. Details of a write operation to memory cell MEMCELLW are explained below with reference to FIG. 3.

Write clock generator CLKGEN receives write clock signal EXCLK and, based on write clock signal EXCLK, generates a clock signal WGCLK.

Local control LCTRL corresponds to write word line WWLW that is used to activate memory cell MEMCELLW to be written. Local control LCTRL receives clock signal WGCLK, and, based on clock signal WGCLK, generates a clock signal LCLK.

Write word line driver WWLDRV corresponds to write word line WWLW, receives clock signal LCLK, and, based on clock signal LCLK, generates write word line signal SWWLW on write word line WWLW. Write word line driver WWLDRV is part of a decoder X-Decode in FIG. 1.

Global control GCTRL generates a signal Y-dsig to decode the address in the Y-direction and to select a global input-output GIOW that corresponds to the pair of write bit lines WBLW and WBLWB and to memory cell MEMCELLW to be written. Global input-output GIOW is also called a data circuit.

Clock generator CLKGEN, also based on write clock signal EXCLK, generates a clock signal DWCLK that activates global input-output GIOW to transfer data DW to write bit lines WBLW and WBLWB to be written to memory cell MEMCELLW.

In FIG. 2, one memory cell MEMCELLW being written is for illustration. More than one memory cell written at the same time is within the scope of various embodiments. For example, 32, 64, 128 etc., memory cells on a same row of a memory word written at the same time are within the scope of various embodiments.

Memory Cell

Figure 3:
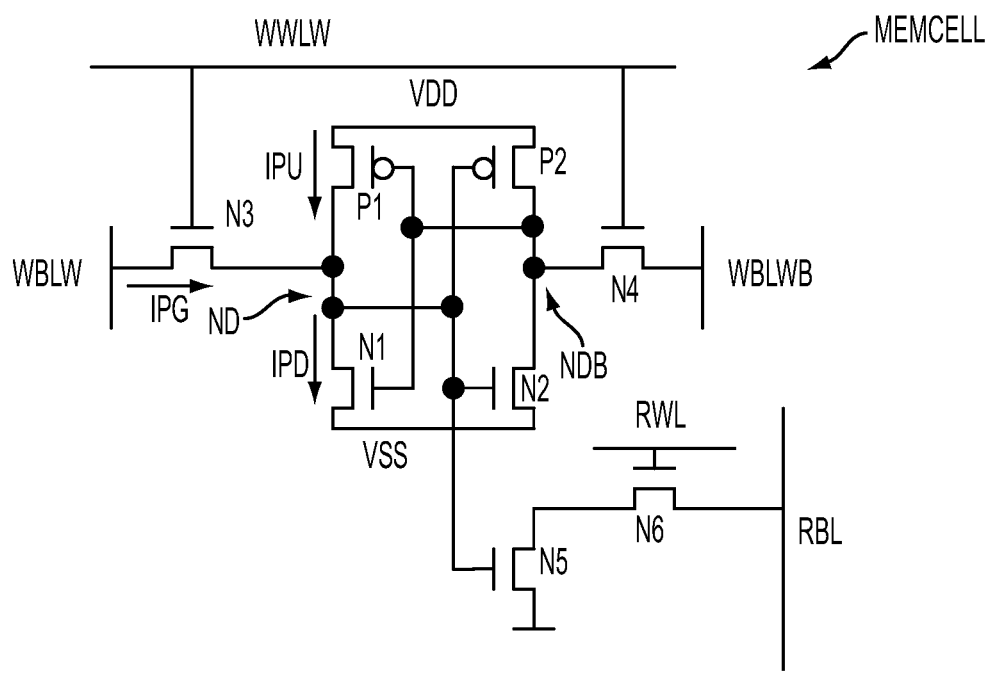
FIG. 3 is a diagram of a memory cell, in accordance with some embodiments.

FIG. 3 is a circuit diagram of a memory cell MEMCELL, in accordance with some embodiments. In some embodiments, a plurality of memory cells MEMCELL is arranged in rows and columns of memory array 138 in FIG. 1. For illustration, memory cell MEMCELL is used to implement memory cell MEMCELLW in FIG. 2.

Memory cell MEMCELL includes two P-type metal oxide semiconductor (PMOS) transistors P1 and P2, and six N-type metal oxide semiconductor (NMOS) transistors N1, N2, N3, N4, N5, and N6. Transistors P1, P2, N1, and N2 form a cross latch. Drains of transistors P1 and N1 are coupled together and form a node ND. Drains of transistors P2 and N2 are coupled together and form a node NDB. Gates of transistors P1 and N1 are coupled together and to drains of transistors P2 and N2. Gates of transistors P2 and N2 are coupled together and to drains of transistors P1 and N1.

Write word line WWLW is coupled with the gate of each of transistors N3 and N4 of a plurality of memory cells MEMCELL in a row of memory cells. Write word line WWLW is also called a write control line because the signal on write word line WWLW controls transistors N3 and N4 for data on write bit lines WBL and WBLB to be written to corresponding nodes ND and NDB.

Drains of each of transistors N3 and N4 are coupled to the pair of write bit lines WBLW and WBLWB, respectively. Write bit lines WBLW and WBLWB are coupled to each drain of transistors N3 and N4 of a plurality of memory cells MEMCELL in a column of memory array 138 in FIG. 1. Each of write bit lines WBLW and WBLWB are also called a write data line because data carried on write bit lines WBLW and WBLWB are written to corresponding nodes ND and NDB.

In a write operation of memory cell MEMCELL, write word line WWLW is activated to turn on transistors N3 and N4. Data to be written to memory cell MEMCELL is transferred to write bit lines WBLW and WBLWB, which is then transferred to and is stored in nodes ND and NDB.

For illustration, data is written to memory cell MEMCELLW in FIG. 2. Further, node ND of memory cell MEMCELLW in FIG. 2 stores a high logical value, and a low logical value is to be written to node ND. In some embodiments, before writing, write bit line WBLW is pre-charged to a high logical value.

Write word line driver WWLDRV then activates write word line signal SWWLW on write word line WWLW. As a result, transistor N3 of memory cell MEMCELLW is turned on. At the same time, based on signal Y-dsig and clock signal DCLK, global input-output GIOW transfers a low logical value of data DW to write bit line WBLW. Transistor N3, being turned on, pulls node ND to a low logical value of write bit line WBLW. In other words, node ND is written with a low logical value. Writing to node NDB with respect to transistor N4 and write bit line WBLWB is similar to writing to node ND with respect to transistor N3 and write bit line WBLW.

A current IPU flows from a source of PMOS transistor P1 to a drain of PMOS transistor P1 or node ND. Current IPU is called a pull-up current because PMOS transistor P1 is used to pull node ND at the drain of transistor P1 to operational voltage VDD at the source of transistor P1. Current IPU is also called a P-side current because current IPU passes through PMOS transistor P1.

A current IPD flows from node ND or a drain of NMOS transistor N1 to a source of transistor N1. Current IPD is called a pull-down current because NMOS transistor N1 is used to pull node ND at the drain of transistor N1 to reference voltage VSS at the source of transistor N1. In some embodiments, reference voltage VSS is ground. Current IPD is also called an N-side current because current IPD passes through NMOS transistor N1.

A current IPG flows from a drain of transistor N3 to a source of transistor N3 or node ND. Current IPG is called a pass gate current because transistor N3, in various embodiments, is called a pass gate transistor that passes the data on write bit line WBLW to node ND.

For illustration, a current value of each of currents IPU, IPD, and IPG when transistors P1, N1, and N3 operate in the saturation mode is called IPUV, IPDV, and IPGV, respectively. In some embodiments, current values IPUV, IPDV, and IPGV symbolized by IPUV:IPDV:IPGV are related to one another by a ratio, for example, $\alpha:\beta:\gamma$. Current values IPUV, IPDV, and IPGV and the ratio $\alpha:\beta:\gamma$ are used to determine sizes of transistors in tracking cell TKCELL that are explained below with reference to FIG. 5.

Transistors N5 and N6, and read word line RWL and read bit line RBL form a read port to process data read from nodes ND and NBD. Read bit line RBL is coupled with memory cells MEMCELL in a column.

Tracking Circuit

FIG. 4 is a block diagram of a memory block 400 that includes memory macro 100 and a memory section 105, in accordance with some embodiments. Memory section 105 includes some circuit elements of a write tracking circuit 410. For simplicity, various elements of memory macro 100 are not shown or not labeled. Write tracking circuit 410 includes clock generator CLKGEN, a tracking word line buffer WLBFFRTK, a tracking write bit line driver WBLDRVTK, and a tracking cell TKCELL. Write tracking circuit 410 is used to generate tracking write signals, such as, a tracking write word line signal SWWLTK (not labeled) on a tracking write word line WWLTK, a tracking write bit line signal SWBLTK (not labeled) on a tracking write bit line WBLTK, a signal WFLIP, a write reset signal WRESET shown in FIG. 6, etc. The tracking write signals are used to generate write signals, such as write word line signal SWWLW and write bit line signal SWBLWB in write circuit 210 in FIG. 2.

Clock generator CLKGEN generates clock signal WGLCK serving as an input for tracking write word line buffer WLBFFRTK.

Tracking write word line buffer WLBFFRTK, based on clock signal WGCLK, generates tracking write word line signal SWWLTK on tracking write word line WWLTK. In some embodiments, tracking write word line WWLTK includes a first metal line MTLINE1 and a second metal line MTLINE2. Each of metal lines MTLINE1 and MTLINE2 correspond to a write word line WWLW in FIG. 2. Metal line MTLINE2 is coupled with a plurality of memory cells MEMCELL. In some embodiments, the number of memory cells MEMCELL coupled with metal line MTLINE2 or with tracking write word line WWLTK is the same as the number of memory cells MEMCELLS coupled with write word line WWLW in write circuit 210 in FIG. 2. Tracking write word line signal SWWLTK on tracking write word line WWLTK, through tracking cell TKCELL, causes a transition of signal WFLIP at an output of tracking cell TKCELL.

Clock generator CLKGEN, based on clock signal EXCLK, also triggers tracking write bit line driver WBLDRVTK to generate tracking write bit line signal SWBLTK on a tracking write bit line WBLTK. Tracking write bit line WBLTK is coupled with a plurality of bit line tracking cells BLTKCELL. The number of bit line tracking cells BLTKCELL is the same as the number of memory cells MEMCELL coupled with the pair of write bit lines WBLW and WBLWB in write circuit 210 in FIG. 2. In some embodiments, a bit line tracking cell BLTKCELL is the same as a memory cell MEMCELL except that the memory cell MEMCELL used as the bit line tracking cell BLTKCELL is configured to store a predetermined logical data, such as a low logical value or a high logical value. Other configurations of a bit line tracking cell BLTKCELL are within the scope of various embodiments. Tracking write bit line signal SWBLTK on tracking write bit line WBLTK, through tracking cell TKCELL, causes a transition of signal WFLIP at the output of tracking cell TKCELL.

In some embodiments, a slower signal of tracking write word line signal SWWLTK and tracking write bit line signal SWBLTK causes the transition of signal WFLIP as explained below with reference to FIG. 5.

Figure 6:
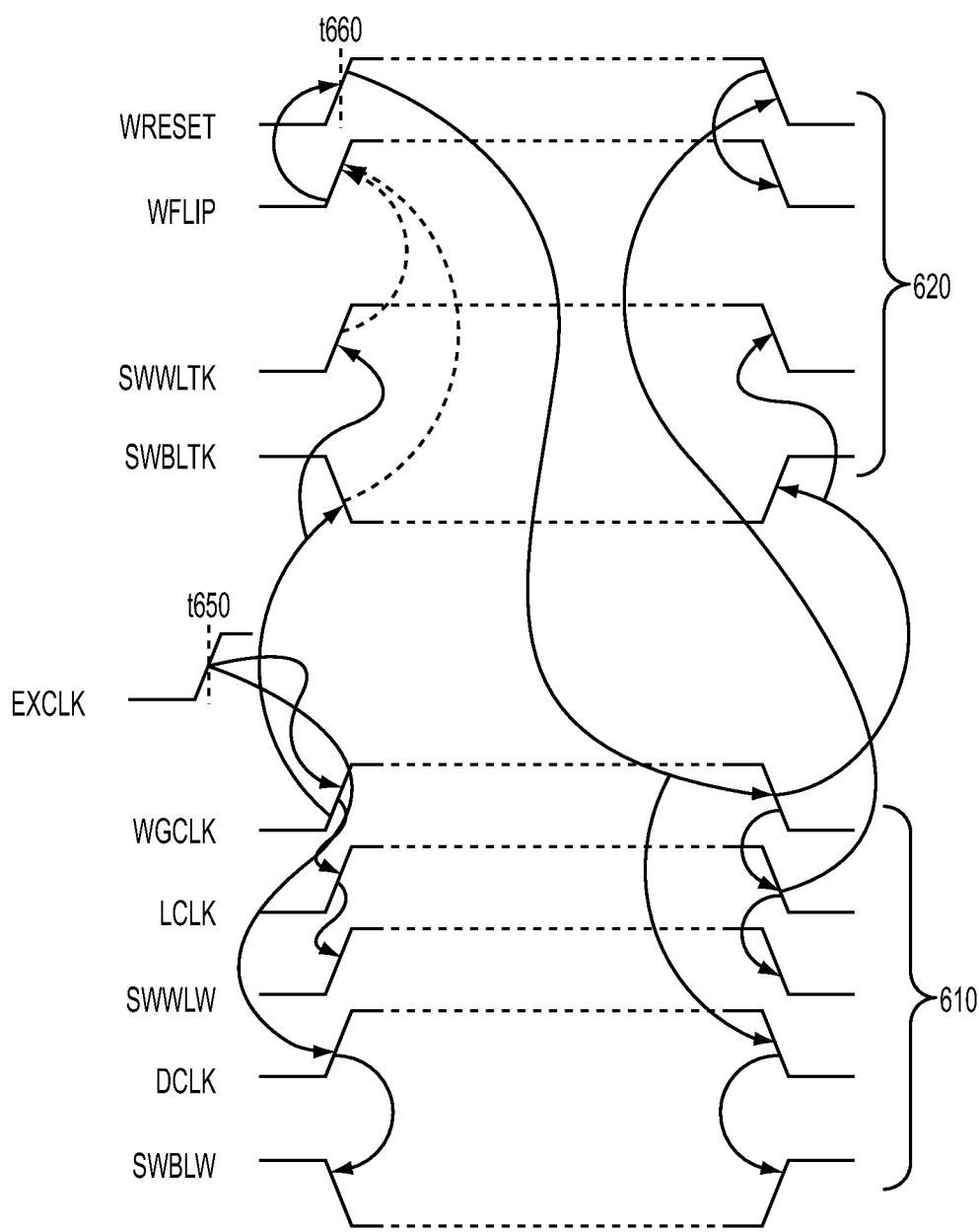
FIG. 6 is a graph of waveforms illustrating the relationship of various write and tracking write signals, in accordance with some embodiments.

A reset circuit RSET in clock generator CLKGEN, based on signal WFLIP, generates a write reset signal WRESET (shown in FIG. 6).

Tracking Cell

Figure 5:
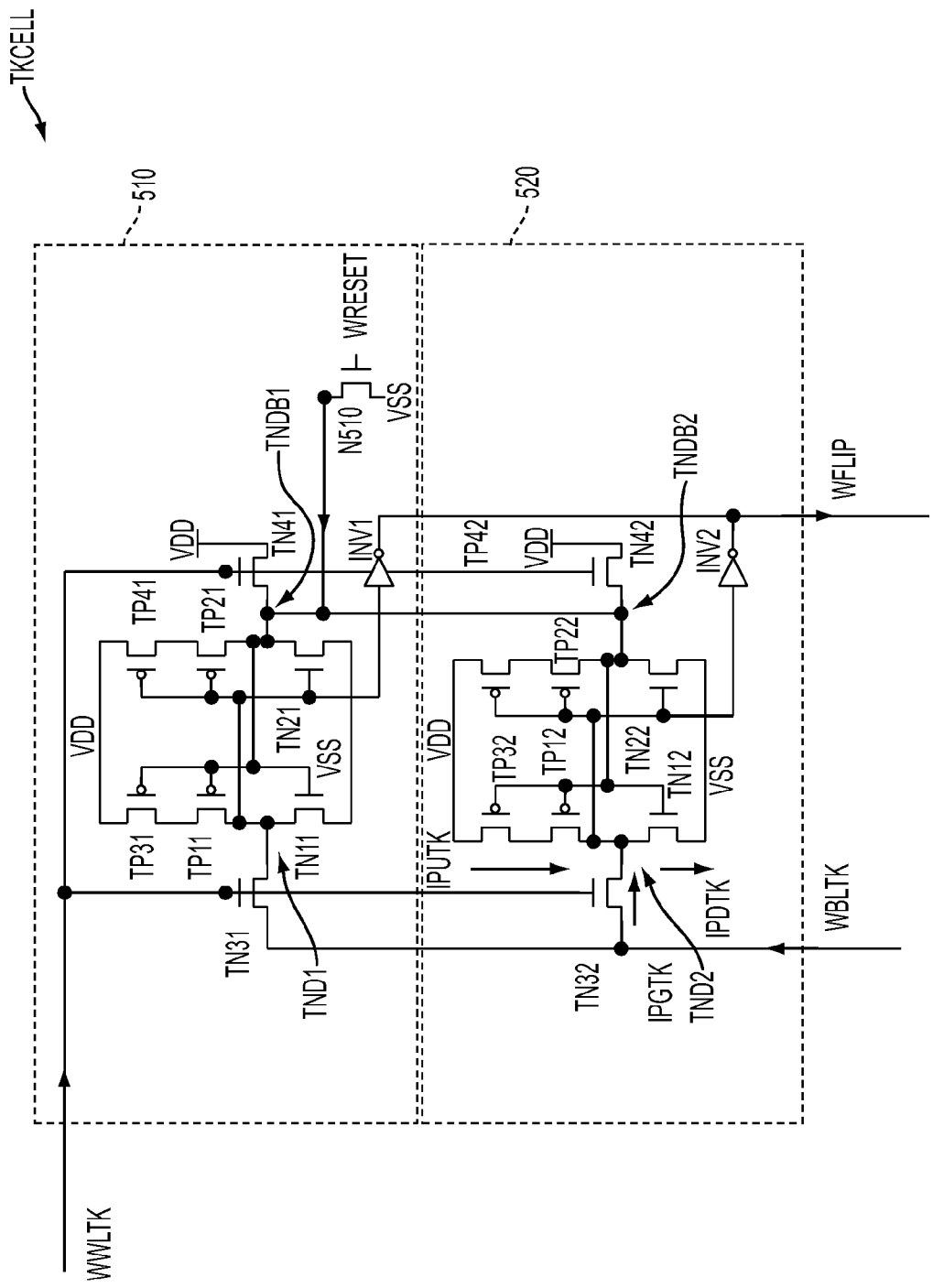
FIG. 5 is a diagram of a tracking cell, in accordance with some embodiments.

FIG. 5 is a diagram of a tracking cell TKCELL, in accordance with some embodiments. Tracking cell TKCELL includes a first sub-circuit 510 and a second sub-circuit 520.

Sub-circuit 510 includes PMOS transistors TP11 and TP21, and NMOS transistors TN11, TN21, TN31, and TN41 corresponding to PMOS transistors P1 and P2 and NMOS transistors N1, N2, N3, and N4 of memory cell MEMCELL in FIG. 3. Configurations of transistors TP11, TP21, TN11, TN21, TN31, and TN41 are similar to configurations of transistors P1, P2, N1, N2, N3, and N4, respectively. Sources of transistors TP11 and TP21, however, are coupled with drains of PMOS transistors TP31 and TP41. A gate of transistor TP31 is coupled with gates of transistors TP11 and TN11, while a source of transistor TP3 is configured to receive operational voltage VDD. A gate of transistor TP41 is coupled to gates of transistors TP21 and TN21, while a source of transistor TP41 is configured to receive operational voltage VDD.

Tracking write word line WWLTK corresponds to write word line WWLW in FIG. 3. Tracking write word line WWLTK is also called a tracking control line because tracking write word line signal SWWLTK on tracking write word line WWLTK controls transistors TN31 and TN32, and TN41 and TN42 for data to be written to corresponding nodes TND1 and TND2, and TNDB1 and TNDB2.

Tracking write bit line WBLTK corresponds to write bit line WBLW or WBLWB in FIG. 3, and is called a tracking data line because the data carried by tracking write bit line WBLTK is written to nodes TND1 and TND2.

Nodes TND1 and TNDB1 correspond to nodes ND and NDB in FIG. 3, respectively.

A drain of transistor TN31 receives tracking write bit line signal SWBLTK on tracking write bit line WBLTK.

A drain of transistor TN41 receives operational voltage VDD.

Gates of transistors TP41, TP21, and TN21 are coupled with an input of an inverter INV1. An output of inverter INV1 provides signal WFLIP.

Write reset signal WRESET is fed to a gate of an NMOS transistor N510. A drain of transistor N510 is coupled with node TNDB1, and a source of transistor 510 is coupled to ground or reference voltage VSS. In some embodiments, write reset signal WRESET rises after signal WFLIP rises. When signal WRESET is logically high, NMOS transistor N510 is turned on. As a result, nodes TNDB1 and TNDB2 are pulled to a low logical value at the source of transistor N510.

Sub-circuit 520 includes PMOS transistors TP12, TP22, TP32, and TP42 and NMOS transistors TN12, TN22, TN32, and TN42 corresponding to PMOS transistors TP11, TP21, TP32, and TP42, and NMOS transistors TN11, TN21, TN31, and TN41 of sub-circuit 510, respectively. Configurations of transistors TP12, TP22, TP32, TP42, TN12, TN22, TN32, and TN42 are similar to configurations of transistors TP11, TP21, TP31, TP41, TN11, TN21, TN31, and TN41, respectively.

Nodes TND2 and TNDB2 correspond to nodes TND1 and TNDB1, respectively.

A drain of transistor TN32 is coupled with the drain of transistor TN31 and receives tracking write bit line signal SWBLTK on tracking write bit line WBLTK. Effectively, tracking write bit line WBLTK is coupled with the drains of transistors TN31 and TN32.

A drain of transistor TN42 receives operational voltage VDD.

Gates of transistors TP42, TP22, and TN22 are coupled with an input of an inverter INV2. An output of inverter INV2 provides signal WFLIP. Effectively, the output of inverter INV2 is coupled with the output of inverter INV1.

As illustratively shown in FIG. 5 and explained above, configurations of sub-circuits 510 and 520 are the same. The below illustration is explained in the context of sub-circuit 520, the illustrative concepts, however, are also applicable to sub-circuit 510.

For illustration, initially, node TND2 has a high logical value while node TNDB2 has a low logical value low. After a write tracking operation according to various embodiments of the present disclosure, node TND2 is logically low while node TNDB2 is logically high. In a write operation, tracking write bit line WBLTK is pre-charged to a high logical value, and tracking write bit line signal SWBLTK is therefore logically high. Tracking write word line WWLTK is activated so that tracking write word line signal SWWLTK is logically high. As a result, transistor TN32 is turned on. When tracking write bit line signal SWBLTK transitions from a high to a low logical value, node TND2 also transitions from a high to a low logical value. Inverter INV2 inverts the low logical value of node TND2 to generate signal WFLIP. As a result, signal WFLIP transitions from a low to a high logical value.

In the above illustration, a logical value of node TND2 and of signal WFLIP are changed based on both tracking write word line signal SWWLTK and tracking write bit line signal SWBLTK. For illustration, a reference to a change in the logical value of either node TND2 or of signal WFLIP refers to the change to the logical value of both node TND2 and of signal WFLIP.

In some embodiments, a slower signal of tracking write word line signal SWWLTK and of tracking write bit line signal SWBLTK causes a change in the logical value of node TND2. For example, when signal SWBLTK is slower than signal SWWLTK, transistor TN32 is turned on, but the data to be written to node TND2 represented by signal SWBLTK has not arrived. As a result, the logical value of node TND2 remains at the same high logical value. When signal SWBLTK arrives later, however, signal SWBLTK pulls node TND2 to a low logical value. Effectively, signal SWBLTK causes node TND2 to change from the high to the low logical value. For another example, when signal SWWLTK is slower than signal SWBLTK, the data represented by signal SWBLTK is ready to be written to node TND2. Because signal SWWLTK has not arrived, however, transistor TN32 is not turned on and the data represented by signal SWBLTK is prevented from being transferred to node TND2. In other words, node TND2 remains the same high logical value. When tracking write word line signal SWWLTK arrives later, however, tracking write word line signal SWWLTK turns on transistor TN32. As a result, the data represented by tracking write bit line signal SWBLTK is transferred to node TND2. Effectively, the high logical value of node TND2 changes from a high to a low logical value. Explained in a different way, tracking write word line signal SWWLTK causes the change in the logical value of node TND2.

In brief, by operation of sub-circuit 520, a slower signal of signal SWWLTK and of signal SWBLTK causes node TND2 and signal WFLIP to change to corresponding logical values. In some embodiments, the slower signal of signals SWWLTK and SWBLTK causes signal WFLIP to transition from a low to a high logical value.

In some embodiments, tracking write word line signal SWWLTK is generated to cover the worst case write timing in the X direction of memory array 138 in FIG. 1, and tracking write bit line signal SWBLTK to cover the worst case write timing in the Y direction. As a result, tracking circuit 410 covers the worst case write timing for different configurations in terms of the length of width X and of height Y of memory array 138 in FIG. 1. For example, when height Y is longer than width X of memory array 138, signal SWBLTK generates signal WFLIP to cover the worst case write situation in the Y direction. In contrast, when width X is longer than height Y, signal SWWLTK covers the worst case write situation in the X direction. Effectively, signals SWWLTK and SWBLTK, regardless of the length of width X and height Y with respect to one another, through tracking cell TKCELL, generate signal WFLIP to cover the worst case timing in a write operation of memory cells in memory macro 100.

In some embodiments, transistors TP11, TP21, TN11, TN21, TN31, TN41, TP12, TP22, TN12, TN22, TN32, and TN42 are logic transistors manufactured by a logic process different from a memory process used to manufacture transistors P1, P2, N1, N2, N3, and N4 of memory cells MEMCELL in FIG. 3. Design rules, electrical characteristics, and manufacturing process for logic transistors are specific for logic transistors while design rules, electrical characteristics, and manufacturing process for memory transistors are specific for memory transistors. In various embodiments, memory array 138 includes up to millions of memory cells and transistors. As a result, memory transistors are designed to be smaller than logic transistors.

A current IPUTK flows from a source of PMOS transistor TP32 to a drain of PMOS transistor TP12 or node TND2. Current IPUTK is called a tracking pull-up current because PMOS transistor TP32 is used to pull node TND2 at the drain of transistor TP12 to operational voltage VDD at the source of transistor TP32. Current IPUTK is also called a P-side current because current IPUTK passes through two PMOS transistors TP12 and TP32. Circuit 520 showing two PMOS transistors TP12 and TP323 is for illustration. A different number of PMOS transistors used in place of two PMOS transistors TP12 and TP32 to provide the same current value for the P-side current IPUTK is within the scope of various embodiments.

A current IPDTK flows from node TND2 or a drain of NMOS transistor TN12 to a source of transistor TN12. Current IPDTK is called a tracking pull-down current because NMOS transistor TN12 is used to pull node TND2 at the drain of transistor TN12 to reference voltage VSS at the source of transistor TN12. Current IPDTK is also called an N-side current because current IPDTK passes through NMOS transistor TN12. Circuit 520 showing one NMOS transistor TN12 is for illustration. A different number of NMOS transistors used in place of NMOS transistor TN12 to provide the same current value for the N-side current IPDTK is within the scope of various embodiments.

A current IPGTK flows from a drain of transistor TN32 to a source of transistor TN32 or node TND2. Current IPGTK is called a tracking pass gate current because transistor TN32, in various embodiments, is called a pass gate transistor that passes the data on tracking write bit line WBLTK to node TND2.

For illustration, a value of each of currents IPUTK, IPDTK, and IPGTK when corresponding transistors TP12, TN12, and TN32 operate in a saturation mode is called IPUTKV, IPDTKV, and IPGTKV, respectively.

In some embodiments, current values IPUV, IPDV, and IPGV of memory MEMCELL in FIG. 3 are related to one another by a ratio, for example, $\alpha:\beta:\gamma$. Transistors TP12, TN12, and TN32 are sized such that current values IPUTKV, IPDTKV, and IPGTKV are related to one another by substantially the same ratio $\alpha:\beta:\gamma$.

In some embodiments, each of transistors TP1, TP2, TP3, TP4, TN1, TN2, TN3, and TN4 is chosen as the smallest logic transistors among available logic transistors. When only one of two circuits 510 and 520 are used as tracking cell TKCELL, a variation in the size of the transistors causes a greater effect to tracking cell TKCELL in terms of circuit performance, the generated currents, etc. In some embodiments as illustratively shown in FIG. 5, two sub-circuits 510 and 520 are used so that variations in the size of each of the transistor would have less effect than having one circuit. A different number of sub-circuits used in place of sub-circuits 510 and 520 is within the scope of various embodiments.

Worst Case Consideration

In some embodiments, tracking circuit 410 and corresponding tracking signals are designed such that each of write word line WWLW and write bit lines WBLW and WBLWB has a large enough pulse width for data to be successfully written into memory cell MEMCELL in various operating conditions of memory cell MEMCELL. In other word, tracking circuit 410 and corresponding tracking signals are designed to cover the worst case condition in a write operation of memory cell MEMCELL. As a result, when a write operation is being performed, the write signals generated based on tracking signals provide sufficient timing margins for the data to be successfully written to a memory cell MEMCELL.

Memory cell MEMCELLW in FIG. 2 is an example of a worst case write condition of memory macro 100. In some embodiments, to achieve the worst case write condition, resistance, capacitance, and time delay of each of tracking write word line WWLTK and tracking write bit line WBLTK are considered with reference to corresponding resistance, capacitance, and time delay of write word line WWLW and write bit lines WBLW and WBLWB. For example, the resistance and capacitance of tracking write word line WWLTK is designed to be equal to or larger than the resistance and capacitance of write word line WWLW of memory cell MEMCELL. Effectively, a time delay of tracking write word line WWLTK is equal to or larger than a time delay of write word line WWLW. Similarly, a resistance, a capacitance, and a time delay of tracking write bit line WBLTK is equal to or larger than a time delay of each of write bit lines WBLW and WBLWB. With reference to tracking circuit 410 in FIG. 4, the combination of tracking write word line buffer WLBFFRTK and metal lines MTLINE1 and MTLINE2 forming tracking write word line WWLTK, and the number of memory cells MEMCELL coupled to tracking write word line WWLTK causes an effective resistance, capacitance, and time delay of tracking write word line WWLTK to be equal to or greater than an effective resistance, capacitance, and time delay of write word line WWLW in FIG. 2. Similarly, the combination of tracking write bit line driver WBLDRVTK, tracking write bit line WBLTK, and the number of bit line tracking cells BLTKCELL coupled with tracking write bit line WBLTK causes an effective resistance, capacitance, and time delay of tracking write bit line WBLTK to be equal to or greater than an effective resistance, capacitance, and time delay of write bit line WBLW in FIG. 2.

Various embodiments of the disclosure are advantageous because write signals generated based on write tracking signals cover the worst case condition for write operations of memory macro 100.

Waveforms

FIG. 6 is a graph of waveforms of relationships of various write signals and tracking write signals, in accordance with some embodiments. A group of signals 610 is related to write circuit 210 while a group of signals 620 is related to write tracking circuit 410. Group of signals 610 includes LCLK, SWWLW, DCLK and SWBLW. Group of signals 620 includes WRESET, WFLIP, SWWLTK and SWBLTK. In this illustration, node ND of memory cell MEMCELLW in circuit 210 in FIG. 2 is initially logically high, and is to be written with a low logical value. Before writing, write bit line signal SWBLW is pre-charged with a high logical value.

With respect to the group of signals 610, at time t650, clock generator CLKGEN receives a rising edge of external clock signal EXCLK, which, in some embodiments, is considered a start of a write operation or a write cycle.

Based on the rising edge of external clock signal EXCLK, clock generator CLKGEN generates a rising edge of clock signal WGCLK.

Local control LCTRL, based on the rising edge of clock signal WGCLK, generates a rising edge of clock signal LCLK.

Write word line driver WWLDRV, based on the rising edge of clock signal LCLK, generates a rising edge of write word line signal SWWLW to turn on transistor N3 of memory cell MEMCELLW.

Based on the rising edge of external clock signal EXCLK, clock generator CLKGEN also generates a rising edge of clock signal DCLK.

Global input-output GIOW, based on clock signal DCLK, transfers a low logical value of data DW to write bit line WBLW so that the low logical value of data DW is transferred to node ND. As illustratively shown in FIG. 6, clock signal DCLK causes write bit line signal SWBLW on write bit line WBLW to transition from a high to a low logical value.

With respect to the group of signals 620, based on the rising edge of clock signal WGCLK, tracking write bit line driver WBLDRTK, causes tracking write bit line signal SWBLTK on tracking write bit line WBLTK to transition from a high to a low logical value. Also based on the rising edge of clock signal WGCLK, tracking write word line buffer WWLBFFR generates a rising edge of tracking write word line signal SWWLTK on write tracking word line WWLTK. Effectively, tracking write word line signal SWWLTK transitions to a high logical value to turn on NMOS transistor TN32.

In some embodiments, the slower signal of signal SWBLTK and signal SWWLTK, causes node TND2 of tracking cell CELLTK to change from a high logical value to a low logical value, which causes signal WFLIP to transition from a low to a high logical value. Effectively, the slower signal of signal SWBLTK and of signal SWWLTK causes signal WFLIP to transition from a low to a high logical value, as illustratively shown by two dashed arrow lines from signals SWBLTK and SWWLTK to the rising edge of signal WFLIP.

At time t660, reset circuit RSET of clock generator CLKGEN generates a rising edge of write reset signal WRESET based on the rising edge of signal WFLIP.

Clock generator CLKGEN, based on the rising edge of write reset signal WRESET, causes clock signal WGCLK to fall.

Based on the falling edge of clock signal WGCLK, tracking write bit line driver WBLDRVTK causes signal SWBLTK to rise, and write word line buffer WLBFFR causes signal SWWLTK to fall.

Also based on the falling edge of clock WGCLK, local control LCTRL causes clock signal LCLK to fall.

Write word line driver WWLDRV, based on the falling edge of clock signal LCLK, causes signal SWWLW to fall.

Also based on the rising edge of write reset signal WRESET, clock generator CLKGEN causes clock signal DCLK to fall.

Global input-output GIOW, based on the falling edge of clock signal DCLK, causes signal SWBLW to rise.

Reset circuit RSET, also based on the falling edge of clock LCLK causes signal WRESET to fall.

Tracking cell TKCELL, based on the falling edge of signal WRESET causes signal WFLIP to fall.

A number of embodiments have been described. It will nevertheless be understood that various modifications may be made without departing from the spirit and scope of the disclosure. For example, various transistors being shown as a particular dopant type (e.g., N-type or P-type metal oxide semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular value when a signal is activated and/or deactivated. Selecting different levels is within the scope of various embodiments. In various embodiments, a transistor functions as a switch. A switching circuit used in place of a transistor is within the scope of various embodiments.

In some embodiments, a circuit includes a clock signal line configured to have a clock signal thereon, a write driver, a data circuit, a memory cell, a tracking write buffer, a tracking write driver, a tracking cell. Based on the clock signal and in a write operation of the memory cell, the write driver circuit is configured to generate a write control signal on a write control line to control the memory cell, the data circuit is configured to provide write data to the memory cell on a write data line, the tracking write buffer is configured to generate a tracking write control signal on a tracking write control line to control the tracking cell, the tracking write driver is configured to generate a tracking write data signal on a tracking write data line to be transferred to the tracking cell, the data to be transferred to the tracking cell is transferred to the tracking cell based on a slower signal of the tracking write control signal and the tracking write data signal, and the tracking cell is configured to generate a tracking signal based on the data transferred to the tracking cell.

Some embodiments regard a method of writing to a memory cell. In the method, based on a clock signal, a first edge of a write control signal on a write control line of the memory cell is generated, a first edge of a write data signal on a write data line of the memory cell is generated, a first edge of a tracking write control signal on a tracking write control line is generated, a first edge of a tracking write data signal on a tracking write data line is generated. Based on a slower signal of the tracking write control signal and the tracking write data signal, a reset signal is generated. Based on the reset signal, a second edge of the write control signal is generated, and a second edge of the write data signal is generated. A time delay of the tracking write control signal is greater than a time delay of the write control signal. A time delay of the tracking write data signal is greater than a time delay of the write data signal.

In some embodiments, a tracking circuit in a memory macro comprises a clock generator circuit, a tracking cell, a tracking write buffer, a first plurality of memory cells, a tracking write control line, a tracking write driver, a second plurality of memory cells, and a tracking write data line. The tracking write control line is coupled with the tracking cell, the tracking write buffer, and the first plurality of memory cells. The tracking write data line is coupled with the tracking cell, the tracking write driver, and the second plurality of memory cells. The clock generator circuit is configured to receive a first clock signal from outside of the memory macro, and, based on the first clock signal, generates a first edge of a second clock signal. The tracking write buffer, based on the first edge of the second clock signal, is configured to generate a first edge of a tracking write control signal on the tracking write control line. The tracking write driver, based on the first edge of the second clock signal, is configured to generate a first edge of a tracking write data signal on the tracking write data line. The tracking cell is configured to be written with data represented by the tracking write data signal based on a slower signal of the tracking write control signal and the tracking write data signal.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A circuit comprising:
a clock signal line configured to have a clock signal thereon;
a write driver;
a data circuit;
a memory cell;
a tracking write buffer;
a tracking write driver; and
a tracking cell,
wherein the circuit is configured so that during a write operation of the memory cell based on the clock signal
the write driver circuit is configured to generate a write control signal on a write control line to control the memory cell;
the data circuit is configured to provide write data to the memory cell on a write data line;
the tracking write buffer is configured to generate a tracking write control signal on a tracking write control line to control the tracking cell;
the tracking write driver is configured to generate a tracking write data signal on a tracking write data line to be transferred to the tracking cell;
the data to be transferred to the tracking cell is transferred to the tracking cell based on a slower signal of the tracking write control signal and the tracking write data signal; and
the tracking cell is configured to generate a tracking signal based on the data transferred to the tracking cell.

2. The circuit of claim 1, wherein the circuit is part of a memory macro.

3. The circuit of claim 2, wherein the memory macro is configured to receive the clock signal from outside of the memory macro.

4. The circuit of claim 1, wherein
the write control line is coupled with a first plurality of memory cells;
the write data line is coupled with a second plurality of memory cells;
the tracking write control line is coupled with a third plurality of memory cells;
the tracking write data line is coupled with a fourth plurality of memory cells;
the first plurality of memory cells is substantially equal to the third plurality of memory cells; and
the second plurality of memory cells is substantially equal to the fourth plurality of memory cells.

5. The circuit of claim 1, wherein
the memory cell includes a cell node configured to receive a cell P-side current, a cell N-side current, and a cell pass gate current;
values of the cell P-side current, the cell N-side current, and the cell pass gate current are related to one another by a first ratio;
the tracking cell includes a tracking node configured to receive a tracking cell P-side current, a tracking cell N-side current, and a tracking cell pass gate current;
values of the tracking cell P-side current, the tracking cell N-side current, and the tracking cell pass gate current are related to one another by a second ratio; and
the first ratio is substantially equal to the second ratio.

6. The circuit of claim 1, wherein
the circuit is configured to meet at least one of the following conditions:
   the tracking write control line is configured to have a tracking control resistance being at least equal to a resistance of the write control line;
   the tracking write control line is configured to have a tracking control capacitance being at least equal to a capacitance of the write control line;
   the tracking write data line is configured to have a tracking data resistance being at least equal to a resistance of the write data line; or
   the tracking write data line is configured to have a tracking data capacitance being at least equal to a capacitance of the write data line.

7. The circuit of claim 1, wherein
the circuit is configured to meet at least one of the following conditions:
   the tracking write control line is configured to have a tracking control time delay being at least equal to a time delay of the write control line; or
   the tracking write data line is configured to have a tracking data time delay being at least equal to a time delay of the write data line.

8. The circuit of claim 1, wherein
transistors in the memory cell are of a first type manufactured by a memory process; and
transistors in the tracking cell are of a second type manufactured by a logic process.

9. A method of writing to a memory cell comprising:
based on a clock signal,
   generating a first edge of a write control signal on a write control line of the memory cell;
   generating a first edge of a write data signal on a write data line of the memory cell;
   generating a first edge of a tracking write control signal on a tracking write control line; and
   generating a first edge of a tracking write data signal on a tracking write data line;
based on a slower signal of the tracking write control signal and the tracking write data signal,
   generating a reset signal; and
based on the reset signal,
   generating a second edge of the write control signal; and
   generating a second edge of the write data signal,
wherein
   a time delay of the tracking write control signal is greater than a time delay of the write control signal; and
   a time delay of the tracking write data signal is greater than a time delay of the write data signal.

10. The method of claim 9, further comprising:
based on the reset signal,
   generating a second edge of the tracking write control signal; and
   generating a second edge of the tracking write data signal.

11. The method of claim 9, further comprising
receiving the clock signal from outside of a memory macro having the memory cell.

12. The method of claim 9, wherein
the write control line is a write word line of a memory macro;
the write data line is a write bit line of the memory macro;
the tracking write control line is coupled with a first plurality of memory cells; and
the tracking write data line is coupled with a second plurality of memory cells.

13. The method of claim 9, further comprising
based on the slower signal of the tracking write control signal and the tracking write data signal and before generating the reset signal,
   transferring data represented by the tracking write data signal to a node of a tracking cell coupled with the tracking write control line and with the tracking write data line; and
   generating an output signal of the tracking cell.

14. A tracking circuit in a memory macro comprising:
a clock generator circuit;
a tracking cell;
a tracking write buffer;
a first plurality of memory cells;
a tracking write control line coupled with the tracking cell, the tracking write buffer, and the first plurality of memory cells;
a tracking write driver;
a second plurality of memory cells; and
a tracking write data line coupled with the tracking cell, the tracking write driver, and the second plurality of memory cells,
wherein
   the clock generator circuit is configured to receive a first clock signal from outside of the memory macro, and, based on the first clock signal, generate a first edge of a second clock signal;
   the tracking write buffer, based on the first edge of the second clock signal, is configured to generate a first edge of a tracking write control signal on the tracking write control line;
   the tracking write driver, based on the first edge of the second clock signal, is configured to generate a first edge of a tracking write data signal on the tracking write data line; and
   the tracking cell is configured to be written with data represented by the tracking write data signal based on a slower signal of the tracking write control signal and the tracking write data signal.

15. The tracking circuit of claim 14, wherein
the tracking cell includes a tracking node having a tracking P-side current, a tracking N-side current, and a tracking pass gate current;
a value of the tracking P-side current and a value of the tracking N-side current have a first relationship;
the value of the tracking P-side current and a value of the tracking pass gate current have a second relationship;
the value of the tracking N-side current and the value of the tracking pass gate current have a third relationship;
a memory cell of the memory macro includes a cell node having a cell P-side current, a cell N-side current, and a cell pass gate current;
a value of the cell P-side current and a value of the cell N-side current have a fourth relationship;
the value of the cell P-side current and a value of the cell pass gate current have a fifth relationship;
the value of the cell N-side current and the value of the cell pass gate current have a sixth relationship;
the first relationship and the fourth relationship are substantially the same;
the second relationship and the fifth relationship are substantially the same; and
the third relationship and the sixth relationship are substantially the same.

16. The tracking circuit of claim 14, wherein
an effective time delay of the tracking write control line is equal to or greater than an effective time delay of a write control line of the memory macro;
the write control line is associated with a memory cell of the memory macro to be written;
an effective time delay of the tracking write data line is equal to or greater than an effective time delay of a write data line of the memory macro; and
the write data line is associated with the memory cell of the memory macro to be written.

17. The tracking circuit of claim 14, wherein
a memory cell of the memory macro has a first plurality of transistors;
the tracking cell has a second plurality of transistors; and
a configuration of the first plurality of transistor is substantially similar to a configuration of the second plurality of transistors.

18. The tracking circuit of claim 14, wherein
a number of memory cells of the first plurality of memory cells is the same as a number of memory cells of a third plurality of memory cells;
the third plurality of memory cells is coupled with a write control line of the memory macro;
the write control line is associated with a memory cell of the memory macro to be written;
a number of memory cells of the second plurality of memory cells is the same as a number of memory cells of a fourth plurality of memory cells;
the fourth plurality of memory cells is coupled with a write data line of the memory macro; and
the write data line is associated with the memory cell of the memory macro to be written.

19. The tracking circuit of claim 14, wherein
the tracking cell is configured to generate an output signal upon being written with the data represented by the tracking write data signal;
the clock generator is configured to generate a second edge of the second clock signal based on the output signal of the tracking cell;
the tracking write buffer, based on the second edge of the second clock signal, is configured to generate a second edge of the tracking write control signal on the tracking write control line; and
the tracking write driver, based on the second edge of the second clock signal, is configured to generate a second edge of the tracking write data signal on the tracking write data line.

20. The tracking circuit of claim 14, wherein
transistors in the tracking cell are of a first type manufactured by a logic process; and
transistors in memory cells of the memory macro are of a second type manufactured by a memory process.

* * * * *